United States Patent
Hyodo et al.

(10) Patent No.: US 6,815,808 B2
(45) Date of Patent: Nov. 9, 2004

(54) HOLLOW AIRTIGHT SEMICONDUCTOR DEVICE PACKAGE

(75) Inventors: Haruo Hyodo, Gunma (JP); Shigeo Kimura, Gunma (JP); Yasuhiro Takano, Gunma (JP)

(73) Assignee: Sanyo Electric, Co., Ltd., Osaka (JP)

(*) Notice: Subject to any disclaimer, the term of this patent is extended or adjusted under 35 U.S.C. 154(b) by 0 days.

(21) Appl. No.: 09/963,267

(22) Filed: Sep. 26, 2001

(65) Prior Publication Data

US 2002/0041016 A1 Apr. 11, 2002

(30) Foreign Application Priority Data

Oct. 10, 2000 (JP) ........................................ 2000-308620

(51) Int. Cl.[7] .............................................. H01L 23/02
(52) U.S. Cl. .................. 257/678; 257/59; 257/352; 257/435; 257/729; 257/778; 257/779; 257/786
(58) Field of Search .................... 257/59, 352, 435, 257/729, 778, 779, 786, 678

(56) References Cited

U.S. PATENT DOCUMENTS

| | | | | |
|---|---|---|---|---|
| 4,663,833 A | * | 5/1987 | Tanaka et al. | 438/65 |
| 5,160,787 A | | 11/1992 | Gaku et al. | |
| 5,277,356 A | * | 1/1994 | Kawauchi | 228/111 |
| 5,327,443 A | * | 7/1994 | Tanaka et al. | 372/36 |
| 5,382,310 A | * | 1/1995 | Ozimek et al. | 156/275.5 |
| 5,590,787 A | * | 1/1997 | Hodges | 206/724 |
| 5,682,057 A | * | 10/1997 | Kuriyama | 257/529 |
| 5,898,218 A | * | 4/1999 | Hirose et al. | 257/710 |
| 5,923,958 A | | 7/1999 | Chou | |
| 6,020,633 A | * | 2/2000 | Erickson | 257/723 |
| 6,111,199 A | * | 8/2000 | Wyland et al. | 174/52.2 |
| 6,117,705 A | * | 9/2000 | Glenn et al. | 438/106 |
| 6,121,675 A | * | 9/2000 | Fukamura et al. | 257/680 |
| RE37,082 E | * | 3/2001 | Butera | 257/678 |
| 6,313,525 B1 | * | 11/2001 | Sasano | 257/704 |
| 6,365,433 B1 | * | 4/2002 | Hyoudo et al. | 438/106 |
| 6,507,264 B1 | * | 1/2003 | Whitney | 337/159 |
| 6,525,397 B1 | * | 2/2003 | Kalnitsky et al. | 257/529 |

FOREIGN PATENT DOCUMENTS

| | | | | |
|---|---|---|---|---|
| DE | 19752196 C1 | 2/1999 | | |
| DE | 19959938 A1 | 10/2000 | | |
| EP | 0 997 934 | 5/2000 | | |
| JP | 07225391 A | * | 2/1994 | ......... G02F/1/1345 |
| JP | Hei..10-173117 | | 6/1998 | ........... H01L/23/50 |

* cited by examiner

*Primary Examiner*—Amir Zarabian
*Assistant Examiner*—Ida M. Soward
(74) *Attorney, Agent, or Firm*—Fish & Richardson P.C.

(57) ABSTRACT

The present invention comprises a first main face (22a) on the surface side of a substrate (21a). An island portion (26) is formed on the first main face (22a) and a semiconductor chip (29), etc. are adhered onto the first main face (22a). The semiconductor chip (29), etc. are sealed in a hollow space made by a column portion (23) and a transparent glass plate (36). Then, the column portion (23) and the glass plate (36) are adhered by the light-shielding adhesive resin made of epoxy resin. Accordingly, there can be provided the semiconductor device and a method of manufacturing the same, which can prevent the direct incidence of the light onto the semiconductor chip (29) and the degradation of the characteristic of the semiconductor chip (29) can be suppressed.

10 Claims, 9 Drawing Sheets

HOLLOW AIRTIGHT SEMICONDUCTOR DEVICE PACKAGE

BACKGROUND OF THE INVENTION

The present invention relates to a semiconductor device that includes a semiconductor element for high frequency applications and an overcurrent-protecting function in a hollow airtight package and a method of manufacturing the same.

An example of the semiconductor device employing the hollow package in the conventional art is shown in FIG. 9. This electronic parts comprise a base substrate 1 formed of ceramic, etc., a lead 2 for external connection, and a cap 3 formed similarly of ceramic. A semiconductor chip 5 is adhered onto a surface of an element mounting portion 4 of the lead 2, then the semiconductor chip 5 and the lead 2 are connected via bonding wires 6, and then the semiconductor chip 5 is sealed in an airtight space 7 constructed by the cap 3 (for example, Patent Application Publication Hei 10-173117).

Such parts are manufactured via steps of preparing the lead 2 in the form of a lead frame, then bonding the semiconductor chip 5 to the lead frame via die bonding or wire bonding, then mounting the base substrate 1 on a bottom surface of the lead frame, then mounting the cap 3 on the base substrate 1 to put the leads 2 between them, and then cutting/shaping the leads 2.

However, in the semiconductor device in the conventional art, there is the subject that, since the base substrate 1 and the cap 3 are mounted on the lead frame every element, the manufacturing steps become complicated and are not suited for the mass production.

Also, there is the problem that, since the semiconductor chip 5 is sealed in the airtight space 7 that is constructed by the cap 3 made of ceramic, etc., the adhesion state cannot be checked by the visual inspection and thus it is difficult to remove the semiconductor device in which the adhesion failure is caused.

SUMMARY OF THE INVENTION

A semiconductor device of the present invention has been made in view of the above circumstances, and comprises a supporting substrate made of insulating material, a conductive pattern provided on a surface of the supporting substrate, and external connecting terminals provided on a back surface and connected electrically to the conductive pattern, a circuit element provided on the conductive pattern, a glass plate adhered to cover the circuit element and to form an airtight hollow portion between the supporting substrate and the glass plate, and an adhesive resin applied to an overall adhered surface of the glass plate.

Preferably, the semiconductor device of the present invention has such a feature that, since the light-shielding adhesive resin is applied to the overall adhesive surface of the glass plate that is used to house the circuit element in the airtight hollow space, the state of the adhered portion can be checked by the visual inspection and also the direct incidence of the light onto the circuit element can be prevented, whereby the change in the characteristic of the circuit element can be avoided in structure.

In order to overcome the above problems, the semiconductor device manufacturing method of the present invention is characterized by comprising a step of preparing a supporting substrate in which a conductive pattern having a large number of mounting portions is provided and external connecting terminals are provided on a back surface, a step of adhering the circuit element onto the mounting portions respectively, a step of applying an adhesive resin to an overall adhesive surface of a glass plate that covers the circuit element and forms an airtight hollow portion between the supporting substrate and the glass plate every mounting portion, a step of adhering the supporting substrate and the glass plate to form the airtight hollow portion every mounting portion, and a step of separating the supporting substrate every mounting portion by dicing adhered portions between the supporting substrate and the glass plate.

Preferably, the semiconductor device manufacturing method of the present invention has such a feature that, since the light-shielding adhesive resin is previously applied to the overall adhesive surface of the glass plate that forms the airtight hollow space in the step of forming the airtight hollow space, a plurality of semiconductor elements can be formed at a time, whereby the manufacturing steps can be simplified and the mass production can be carried out.

DETAILED DESCRIPTION OF THE PREFERRED EMBODIMENT

Embodiments of the present invention will be explained in detail with reference to the drawings hereinafter.

Figure 1A:
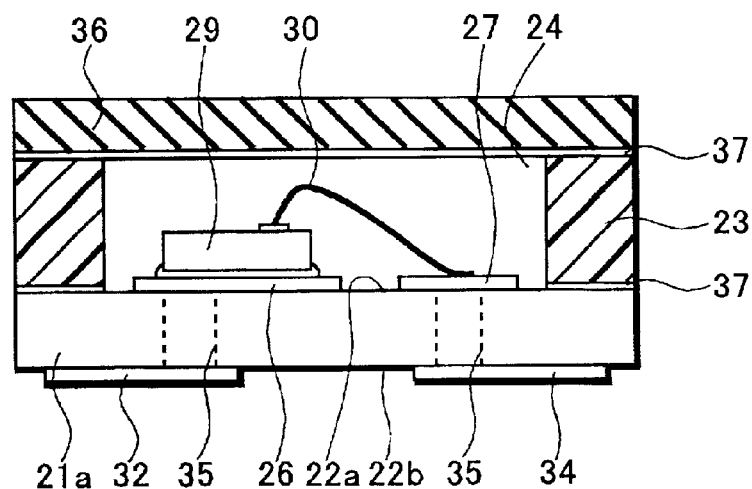
FIG. 1A is a sectional view of the semiconductor device according to the present invention and FIG. 1B is a plan view thereof.
Figure 1B:
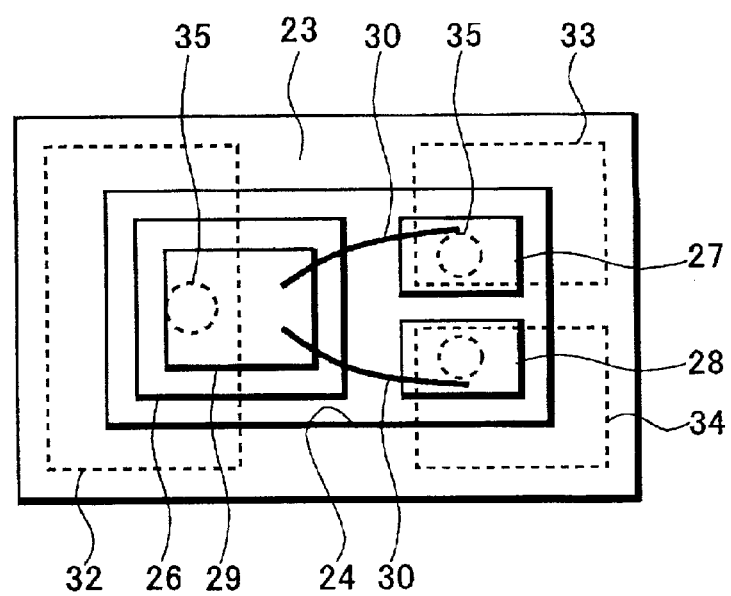

FIG. 1A is a sectional view and FIG. 1B is a plan view showing an embodiment of the semiconductor device of the present invention. A substrate 21a divided from a large-sized substrate 21 is formed of insulating material such as ceramic, glass epoxy, etc., and has a plate thickness of 100 to 300 $\mu$m and a rectangular shape whose long side ×short side is about 2.5 mm×1.9 mm when it is viewed as a plan view (viewed as shown in FIG. 1B). Also, the substrate 21a has a first main face 22a on the surface side and a second main face 22b on the back surface side respectively, and these faces extend in parallel with each other. A column portion 23 is an pillar portion that is provided on an outer periphery of the substrate 21a to have a height of about 0.4 mm and a width of about 0.5 mm. A concave portion 24 is formed on the center portion of the substrate 21a by the column portion 23. The substrate 21a and the column portion 23 both are formed as separate members are adhered by the adhesive 37. In this case, the substrate 21a and the column portion 23 both are integrated together previously may be employed.

A surface of the first main face 22a of the substrate 21a is formed flat, and an island portion 26 and electrode portions 27, 28 are formed on the surface by conductive patterns such as the gold plating, or the like. Then, a semiconductor chip 29 such as a Schottky barrier diode, a MOSFET element, or the like, for example, is die-bonded to the island portion 26 of the substrate 21a. An electrode pad formed on a surface of the semiconductor chip 29 and the electrode portions 27, 28 are connected by bonding wires 30.

External connecting terminals 32, 33, 34 are formed on the surface of the second main face 22b of the substrate 21a by the conductive patterns such as the gold plating, or the like. In addition, a via hole 35 that passes through the substrate 21a from the first main face 22a to the second main face 22b is provided in the electrode portions 32, 33, 34. An inside of the via hole 35 is filled with conductive material such as tungsten, silver, copper, or the like, so that the island portion 26, the electrode portion 27, and the electrode portion 28 are connected electrically to the external connecting terminal 32, the external connecting terminal 33, and the external connecting terminal 34 respectively. End portions of the external connecting terminals 32, 33, 34 are retreated from the end portion of the substrate 21a by about 0.01 to 0.1 mm. Also, since upper surfaces of the via holes 35 of the electrode portion 27, 28 are not flat, it is preferable that the bonding wire 30 should be connected to avoid the upper surfaces of the via holes 35 of the electrode portion 27, 28 respectively. The external connecting terminals 32, 33, 34 are formed in advance on the large-sized substrate 21.

In order to form the inside of the concave portion 24 as a closed space, a transparent glass plate 36 having a plate thickness of about 0.1 to 0.3 mm is employed as a lid member. Since the glass plate 36 covers a number of concave portions 24 formed on the large-sized substrate 21, the light-shielding adhesive resin 37 is previously applied to the overall adhered surface of the glass plate 36. Also, since the upper portion of the column portion 23 forming the concave portion 24 and the adhered surface of the glass plate 36 are adhered, the semiconductor chip 29 and the metal thin wire 30 can be housed perfectly in the airtight space.

Here, since the light-shielding adhesive resin 37 is applied to the overall adhered surface of the glass plate 36, the light that transmits the glass plate 36 can be cut off by the light-shielding adhesive resin 37 and thus the light does not directly enter into the semiconductor chip 29, etc. in the concave portion 24.

The column portion 23 cut by the dicing surrounds the peripheral area of the semiconductor chip 29, and the cut glass plate 36 closes tightly the upper area thereof. The column portion 23 and the first main face 22a of the substrate 21a are adhered by the adhesive 37, and the column portion 23 and the glass plate 36 are adhered by the adhesive 37. As a result, the semiconductor chip 29 and the metal thin wires 30 are housed in the airtight space constructed by the concave portion 24. Outer peripheral end surfaces of the substrate 21a, the column portion 23, and the glass plate 36 are cut by the dicing so as to form flat cut end surfaces.

The above semiconductor device is mounted such that the external connecting terminals 32, 33, 34 are opposed/adhered to the electrode patterns on the packaging substrate.

Here, an embodiment in which respective semiconductor chips that are adhered onto respective mounting portions are covered with a common resin layer by covering a resin layer with the substrate will be explained in brief.

The large-sized substrate in which a plurality of mounting portions are arranged in a matrix fashion, e.g., 100 portions are arranged in 10 rows and 10 columns, on the substrate having the plate thickness of 200 to 350 $\mu$m that can maintain the mechanical strength during the manufacturing steps is prepared. The substrate is an insulating substrate made of ceramic, glass epoxy, or the like. Then, the semiconductor chips are die-bonded to respective mounting portions and then all semiconductor chips are covered with the common resin layer by dropping (potting) epoxy liquid resin by a predetermined amount. After the dropped resin layer is cured by the heat treatment executed at 100 to 200 degree for several hours, a surface of the resin layer is worked into a flat surface by grinding curved surfaces. In the grinding, the grind apparatus is used to grind the surface of the resin layer by the grind blade such that the surface of the resin layer has a uniform height from the substrate. In this step, a film thickness of the resin layer is formed to 0.3 to 1.0 mm.

Figure 2A:
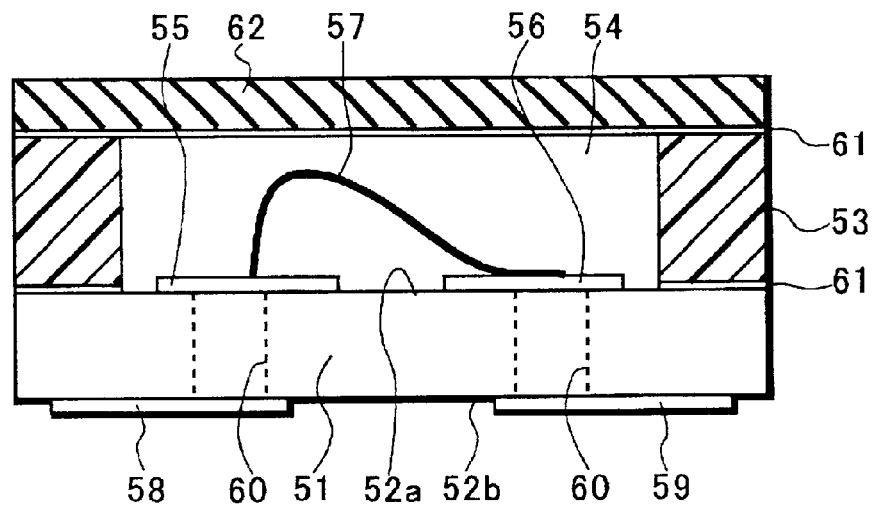
FIG. 2A is a sectional view of the overcurrent-protecting device according to the present invention and FIG. 2B is a plan view thereof.
Figure 2B:
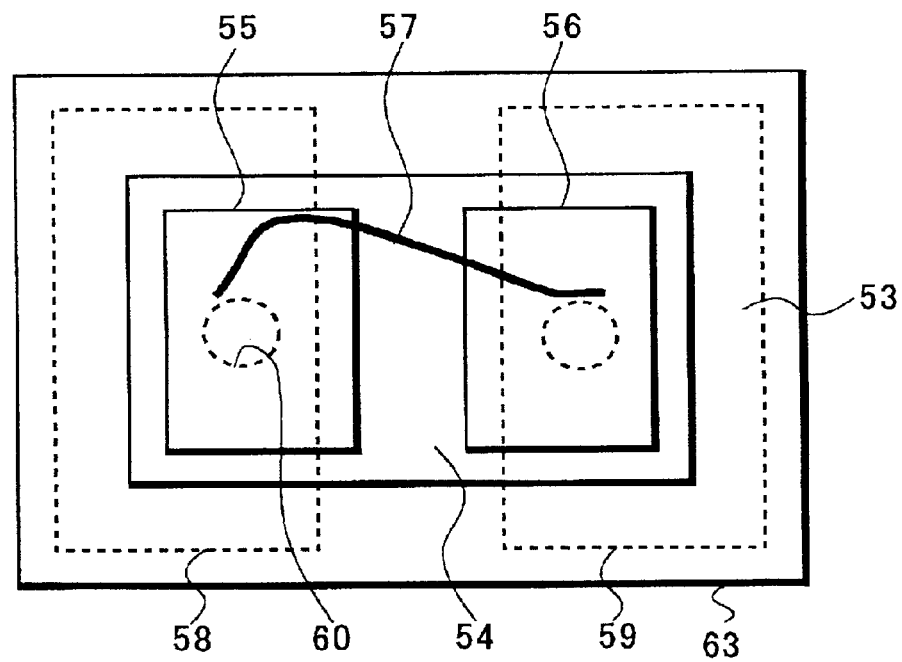

Next, FIG. 2A is a sectional view and FIG. 2B a plan view showing an embodiment of an overcurrent-protecting device using a fuse. A substrate 51 is formed of insulating material such as ceramic, glass epoxy, etc. The substrate 51 has a plate thickness of 100 to 300 $\mu$m and a rectangular shape whose long side × short side is about 2.5 mm×1.9 mm when it is viewed as a plan view (viewed as shown in FIG. 2B). Also, the substrate 51 has a first main face 52a on the surface side and a second main face 52b on the back surface side respectively. A column portion 53 is an side portion that is provided on an outer periphery of the substrate 51 to have a height of about 0.4 mm and a width of about 0.5 mm. A concave portion 54 is formed on the center portion of the substrate 51 by the column portion 53. The substrate 51 and the column portion 53 both are formed as separate members are adhered by the adhesive 61. In this case, the substrate 51 and the column portion 53 both are integrated together previously may be employed.

A surface of the first main face 52a of the substrate 51 is formed flat, and electrode portions 55, 56 are formed on the surface by conductive patterns such as the gold plating, or the like. A metal thin wire 57 having a diameter of 30 $\mu$m, for example, is provided between the electrode portions 55, 56 by the wire bonding. The metal thin wire 57 is formed of a gold wire having a purity of 99.99%, a solder thin wire, or the like. The metal thin wire 57 is first bonded to the electrode portion 55 and is second bonded to the electrode portion 56 such that a wire loop is formed to have a height smaller than a height of the concave portion 54.

External connecting terminals 58, 59 are formed on the surface of the second main face 52b of the substrate 51 by the conductive patterns such as the gold plating, or the like. In addition, a via hole 60 passing through the substrate 51 is provided under the electrode portions 55, 56 respectively. An inside of the via hole 60 is filled with conductive material such as tungsten, or the like, so that the electrode portion 55 and the electrode portion 56 are connected electrically to the external connecting terminal 58 and the external connecting terminal 59 respectively. End portions of the external connecting terminals 58, 59 are retreated from the end portion of the substrate 51 by about 0.01 to 0.1 mm. Also, since upper surfaces of the via holes 60 of the electrode portion 55, 56 are not flat, it is preferable that the bonding wire 57 should be connected to avoid the upper surfaces of the via holes 60 of the electrode portion 55, 56 respectively.

In order to form the inside of the concave portion 54 as a closed space, a transparent glass plate 62 having a plate thickness of about 0.1 to 0.3 mm is employed as a lid member. Since the glass plate 62 covers a number of concave portions 54 formed on the large-sized substrate 21, the light-shielding adhesive resin 61 is previously applied to the overall adhered surface of the glass plate 62. Also, since the upper portion of the column portion 53 forming the concave portion 54 and the adhered surface of the glass plate 62 are adhered, the metal thin wire 57 can be housed perfectly in the airtight space.

Here, since the light-shielding adhesive resin 61 is applied to the overall adhered surface of the glass plate 62, the light that transmits the glass plate 62 can be cut off by the light-shielding adhesive resin 61 and thus the light does not directly enter into the metal thin wire 57, etc. in the concave portion 54.

The above overcurrent-protecting device is mounted such that the external connecting terminals 58, 59 are opposed/adhered to the electrode patterns on the packaging substrate. When an overcurrent in excess of the rated current is flown between the external connecting terminals 58, 59, such overcurrent flows through the metal thin wire 57 to cause the rapid temperature rise due to the specific resistance of the metal thin wire 57. The metal thin wire 57 is melt down by this heat generation to perform a protection function against the overcurrent. If a gold (Au) wire having the diameter of 30 μm and a wire length of about 0.7 mm is employed, the fusing current is about 4 A (1 to 5 seconds). In many cases, because of the relationship between the radiation and the resistance, the metal thin wire 57 is melt down in its middle portion rather than its end portions close to the electrode portions 55, 56. At this time, since the fused portion does not contact to other material such as the resin, the device in which the ignition, the emitting smoke, the change of color, and the deformation are not generated in appearance can be obtained. Also, since the metal thin wire 57 is melted down, the device in which both terminals are disconnected perfectly at the time of the overcurrent can be formed.

The fuse element can be formed by forming a part of the conductive patterns constituting the electrode portions 55, 56 as a narrow wedge-like shape successively, by adhering a polysilicon resistor to the metal thin wire, or the like in addition to the metal thin wire. In summary, any means may be employed if the fused portion is housed in the concave portion 54. Also, although the concave portion 54 is airtightly closed in the air, the incombustible gas to form the nitrogen atmosphere, etc., for example, can be filled therein.

As described above, according to the semiconductor device of the present invention, since the transparent glass plate 36 is employed to seal the semiconductor chip 29, the bonding wires 30, etc. airtightly in the hollow space, the state of the adhered portion between the glass plate 36 and the column portion 23 can be checked by the visual inspection. Also, since the light-shielding adhesive resin 37 is applied to the entire adhered surface of the glass plate 36, there can be prevented such an event that the light that transmits through the glass plate 36, enters into the concave portion 24 and directly enters into the semiconductor chip 29, etc. and thus the degradation of the characteristic of the semiconductor chip 29, etc. is caused.

In addition, in the semiconductor device of the present invention, the hollow structure can be formed by employing the column portion 23 and the glass plate 36, and also the semiconductor chip 29, etc. that are die-bonded onto the substrate 21a are housed in the airtight space constructed by the concave portion 24 as the hollow portion. Accordingly, a material cost can be lowered extremely in contrast to the case where the substrate 21a is covered with the resin layer and therefore the semiconductor chips 29 adhered onto the mounting portions are covered with the resin layer.

Further, in the semiconductor device of the present invention, the hollow structure can be formed by using the column portion 23 and the glass plate 36 and also the step of planarizing the surface of the semiconductor element is not needed because the glass plate 36 is employed as the lid body of the hollow structure. Therefore, a production cost can be lowered extremely rather than the case where the substrate 21a is covered with the resin layer and therefore the semiconductor chips 29 adhered onto the mounting portions are covered with the resin layer.

Besides, the via holes 35 passing through the substrate 21a from the first main face 22a to the second main face 22b are formed in the substrate 21a. Then, the insides of the via holes 35 are filled with the conductive material such as tungsten, silver, copper, etc., and also the island portion 26, the electrode portion 27, and the electrode portion 28 are connected electrically to the external connecting terminals 32, 33, 34 respectively, so that internal elements and the external connecting terminals can be connected electrically with no lead that is extended from the substrate 21a to the outside. Therefore, a packaging area can be reduced extremely when the semiconductor device is packaged onto the printed board.

A first manufacturing method of the semiconductor device shown in FIG. 1 will be explained in detail hereinafter.

Figure 3A:
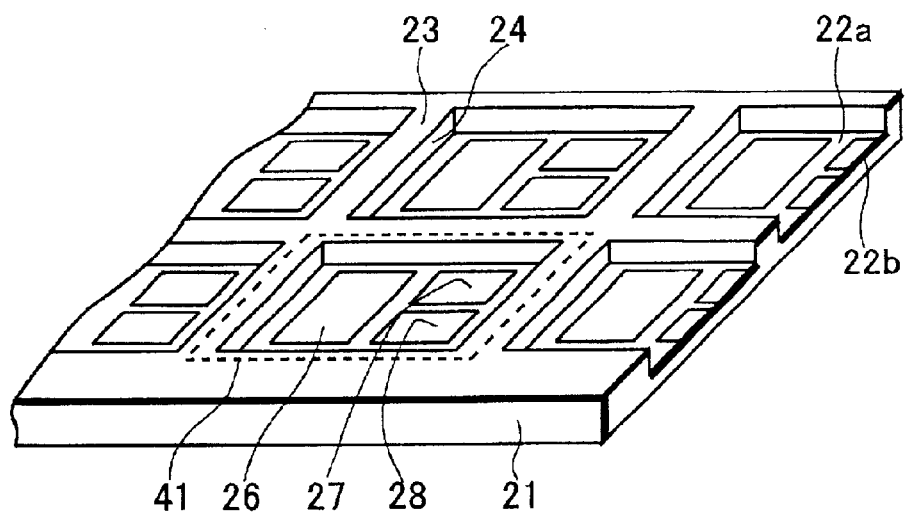
FIGS. 3A and 3B are perspective views showing the present invention.

First Step: see FIG. 3A

At first, the large-sized substrate 21 is prepared. The large-sized substrate 21 is formed of insulating material such as ceramic, glass epoxy, etc. and has a plate thickness of 100 to 300 μm. Also, the large-sized substrate 21 has the first main face 22a on the surface side and the second main face 22b on the back surface side respectively. A symbol 23 is a lattice-like column portion having a height of 0.1 to 0.5 mm and a constant width of about 0.25 to 0.5 mm, and forms the concave portion 24 in which the center portion of the substrate 21 is depressed by the column portion 23. The substrate 21 and the column portion 23 are formed integrally in advance to form the above plate thickness including the column portion 23. In this case, the structure in which the substrate 21 and the column portion 23 are formed individually and then adhered/fixed together may be prepared.

The concave portions 24 each having a size of about 0.8 mm×0.6 mm, for example, are arranged at an equal distance vertically and laterally on the substrate 21. A large number of sets of the island portions 26 and the electrode portions 27, 28 are drawn on the first main faces 22a of the concave portions 24 by the conductive patterns formed of the gold plating. The concave portion 24 and a part of the column portion 23 of the substrate 21 surrounding the concave portion 24 constitute the element mounting portion 41.

Figure 3B:
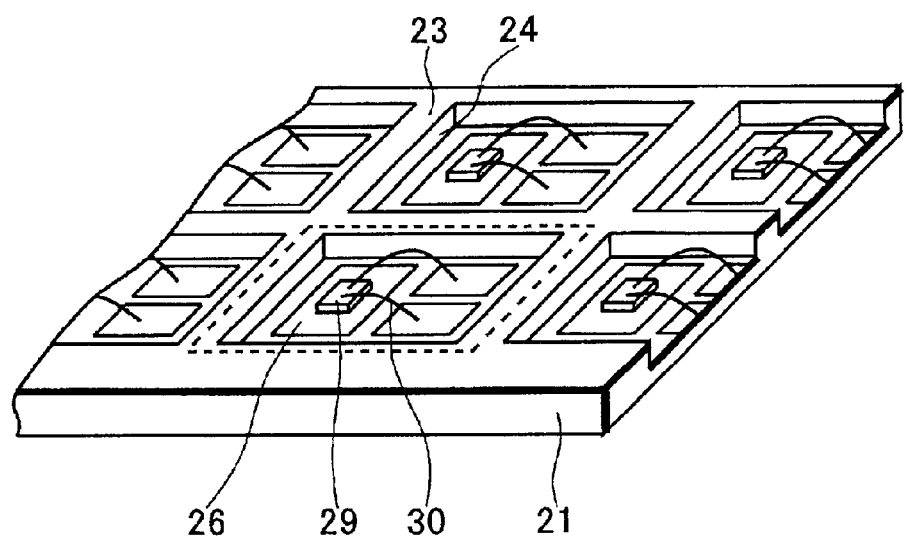

Second Step: see FIG. 3B

After such substrate 21 is prepared, the semiconductor chip 29 is die-bonded to the island portion 26 every concave portion 24 and the bonding wire 30 is wire-bonded. Then, one sides of the bonding wires 30 that are wire-bonded to the semiconductor chip 29 are connected to the electrode portions 27, 28. A loop height of the bonding wire 30 at this time is set to a height that is lower than a height of the column portion 23.

Figure 4A:
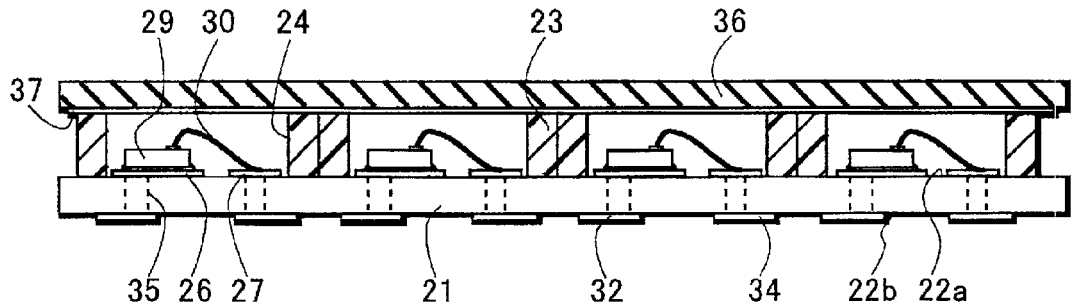
FIG. 4A is a sectional view of the present invention and FIGS. 4B and 4C are perspective views showing the present invention.
Figure 4B:
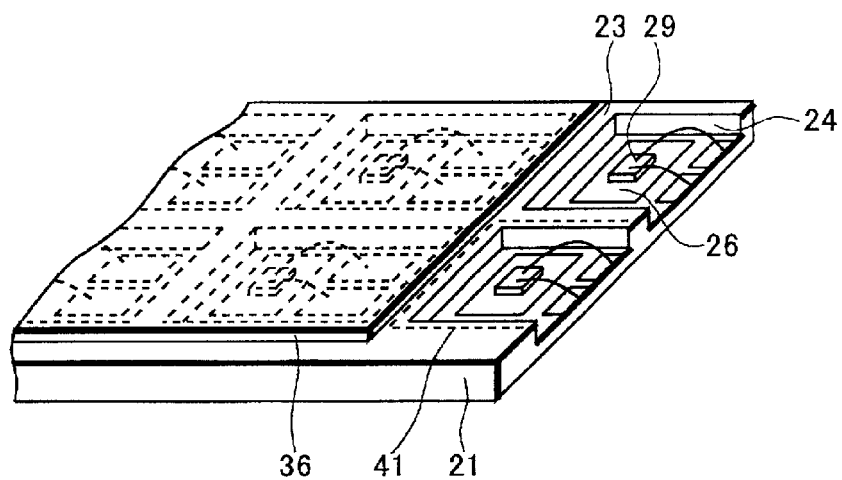

Third Step: see FIGS. 4A and B

The transparent glass plate 36 having a plate thickness of about 0.1 to 0.3 mm is prepared, and then the light-shielding adhesive resin 37 is applied to the overall adhered surface of the glass plate 36. Then, the glass plate 36 is adhered as a lid member that constitutes the hollow airtight structures on the mounting portions 41 including a plurality of concave portions 24 that are formed by using the large-sized substrate 21 and the column portions 23. Accordingly, the semiconductor chip 29 and the bonding wire 30 can be perfectly housed in the airtight space. At this time, as described above, since the light-shielding adhesive resin 37 is applied to the overall surface of the glass plate 36, a large quantity of semiconductor elements can be formed at a time.

Here, the column portion 23 may be adhered to the large-sized substrate 21 later, otherwise the large-sized substrate 21 and the column portion 23 may be integrally formed together previously. Also, the concave portions 24 may be formed by digging the large-sized substrate 21.

After this, it is visually checked whether or not the adhesion failure is caused between the column portion 23 and the glass plate 36.

Figure 4C:
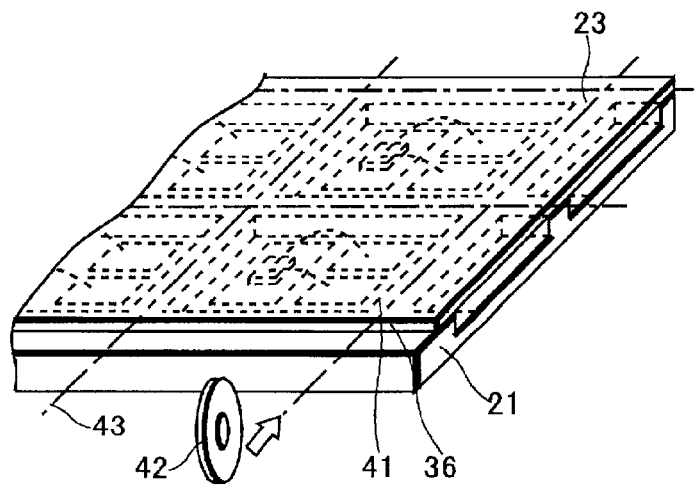

Fourth Step: see FIG. 4C

Figure 5:
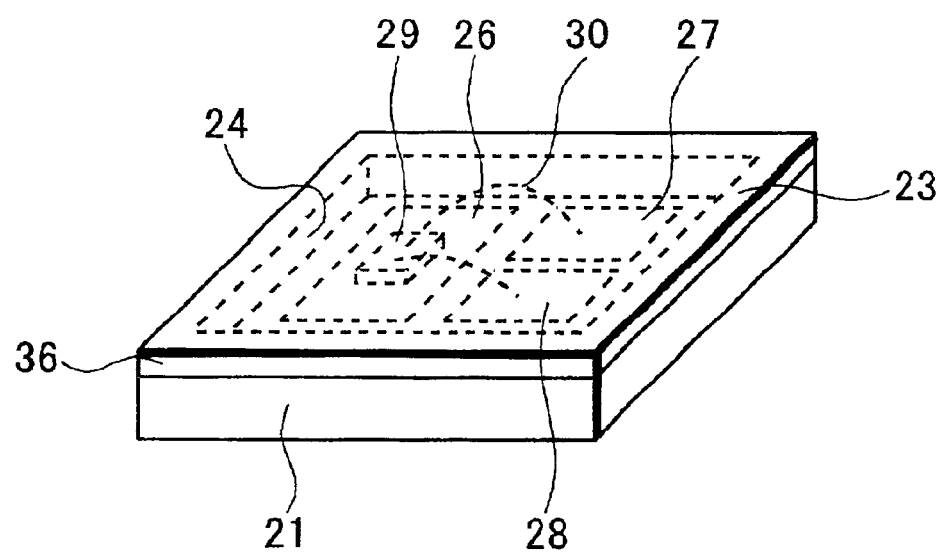
FIG. 5 is a perspective view showing the present invention.

Then, individual devices shown in FIG. 5 can be obtained by dividing the substrate 21 into respective mounting portions 41 based on alignment marks formed on the surface of the substrate 21. A dicing blade 42 is used to divide, and a dicing sheet is pasted on the back surface side of the substrate 21 and then the substrate 21 and the glass plate 36 are collectively cut away along dicing lines 43 vertically and laterally. In this case, the dicing line 43 is positioned in the center of the column portion 23. Also, the dicing sheet may be pasted on the glass plate 36 side and then the dicing may be applied from the second main face 22b side.

A second manufacturing method of the semiconductor device shown in FIG. 1 will be explained in detail hereinafter. This is the case where the column portion 23 is constructed as the discrete parts.

Figure 6A:
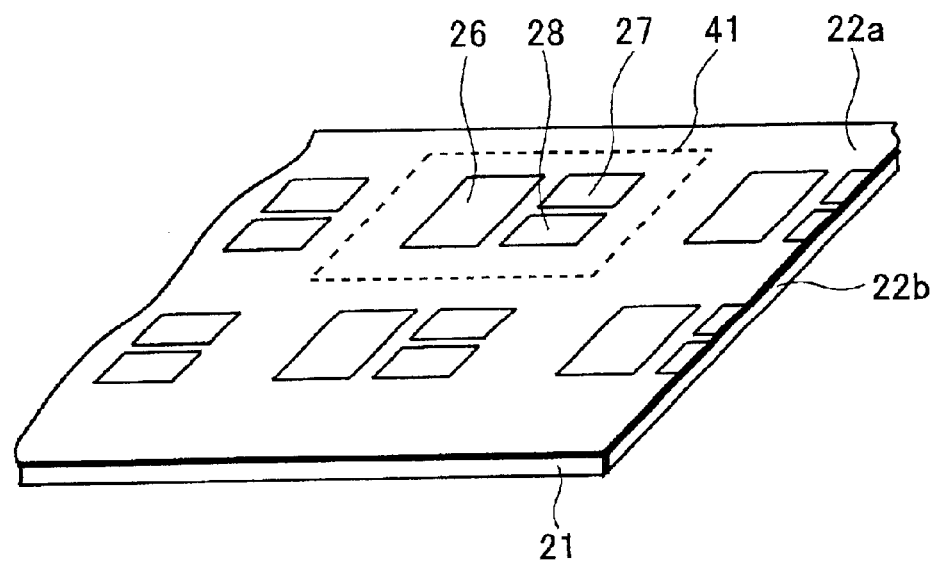
FIGS. 6A and 6B are perspective views showing the present invention.

First Step: see FIG. 6A

At first, the large-sized flat substrate 21 is prepared. The large-sized substrate 21 is formed of insulating material such as ceramic, glass epoxy, etc. and has a plate thickness of 100 to 300 µm. Also, the large-sized substrate 21 has the first main face 22a on the surface side and the second main face 22b on the back surface side respectively. A large number of sets of the island portions 26 and the electrode portions 27, 28 are drawn on the surface of the first main faces 22a by the conductive patterns formed of the gold plating. The area that surrounds the island portion 26 and the electrode portions 27, 28 constitutes the element mounting portion 41. A large number of element mounting portions 41 are arranged at an equal distance vertically and laterally.

Figure 6B:
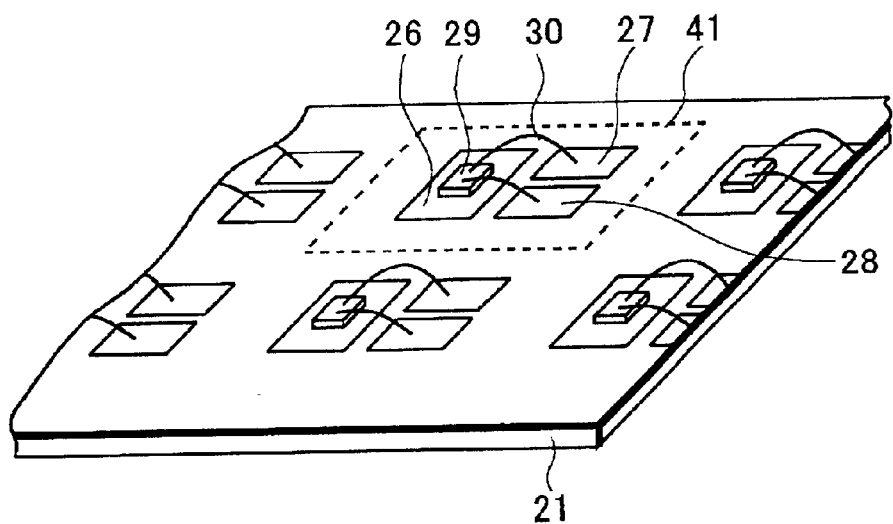

Second Step: see FIG. 6B

After such substrate 21 is prepared, the semiconductor chip 29 is die-bonded to the island portion 26 every element mounting portion 41 and the bonding wire 30 is wire-bonded. Then, one sides of the bonding wires 30 that are wire-bonded to the semiconductor chip 29 are connected to the electrode portions 27, 28. A loop height of the bonding wire 30 at this time is set to a height that is smaller than a depth of the concave portion 24.

Figure 7A:
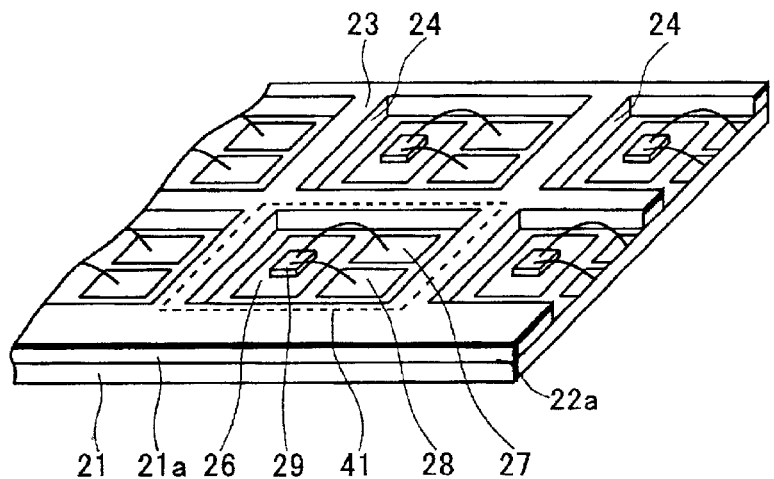
FIGS. 7A and 7C are perspective views showing the present invention and FIG. 7B is a sectional view of the present invention.

Third Step: see FIG. 7A

The second substrate 21a having the concave portions 24 (through holes) at positions that correspond to the element mounting portions 41 is adhered/fixed to the surface of the first main face 22a on the substrate 21 to which the die bonding and the wire bonding have been applied. The adhesive such as epoxy adhesive, etc. is employed to adhere. The concave portions 24 each having a size of about 0.8 mm×0.6 mm, for example, are arranged at an equal distance vertically and laterally on the second substrate 21b. The column portion 23 having a height of about 0.1 to 0.2 mm and a width of about 0.2 to 0.5 mm is provided between the concave portions 24 so as to surround the concave portion 24 in a lattice fashion. As a result, the island 26, the semiconductor chip 29, the electrode portions 27, 28, etc. are exposed from the concave portion 24, which is equivalent to the state in FIG. 3B. According to this approach, since the die bonding and the wire bonding can be applied to the flat substrate 21, the contact between the vacuum collet or the bonding tool and the column portion 23 can be eliminated and thus a dimension of the concave portion 24 can be reduced.

Figure 7B:
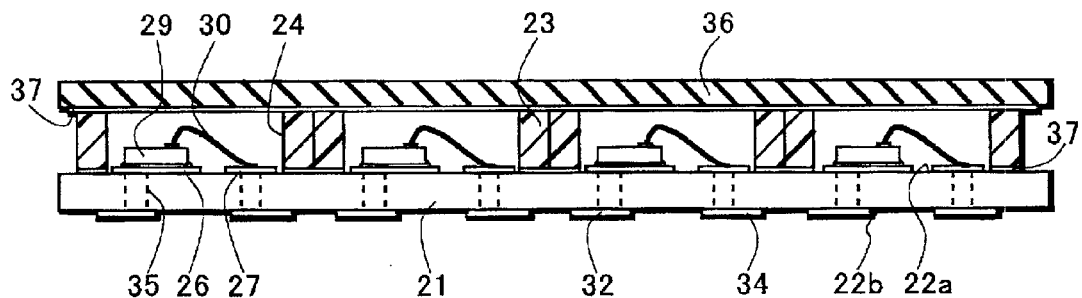
Figure 7C:
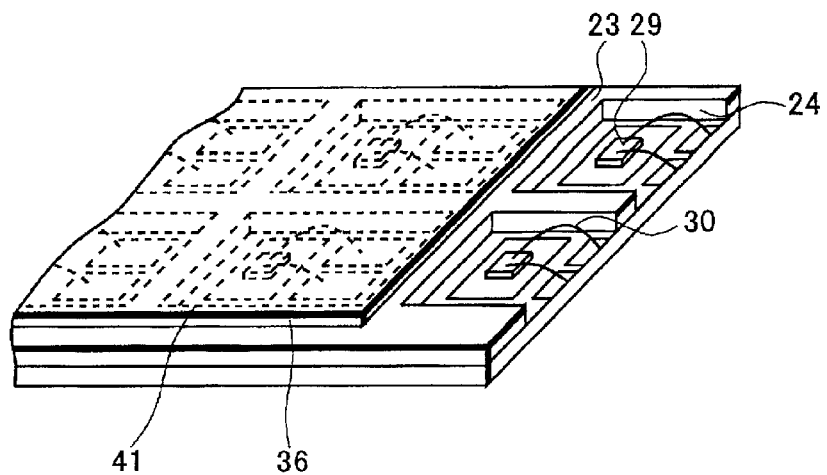

Fourth Step: see FIGS. 7B and C

The transparent glass plate 36 having a plate thickness of about 0.1 to 0.3 mm is prepared, and then the light-shielding adhesive resin 37 is applied to the overall adhered surface of the glass plate 36. Then, the glass plate 36 is adhered as a lid member that constitutes the hollow airtight structures on the mounting portions 41 including a plurality of concave portions 24 that are formed by using the large-sized substrate 21 and the column portions 23. As a result, the semiconductor chip 29 and the bonding wire 30 can be perfectly housed in the airtight space. At this time, as described above, since the light-shielding adhesive resin 37 is applied to the overall surface of the glass plate 36, a large quantity of semiconductor elements can be formed at a time.

After this, it is visually checked whether or not the adhesion failure is caused between the column portion 23 and the glass plate 36.

Figure 8A:
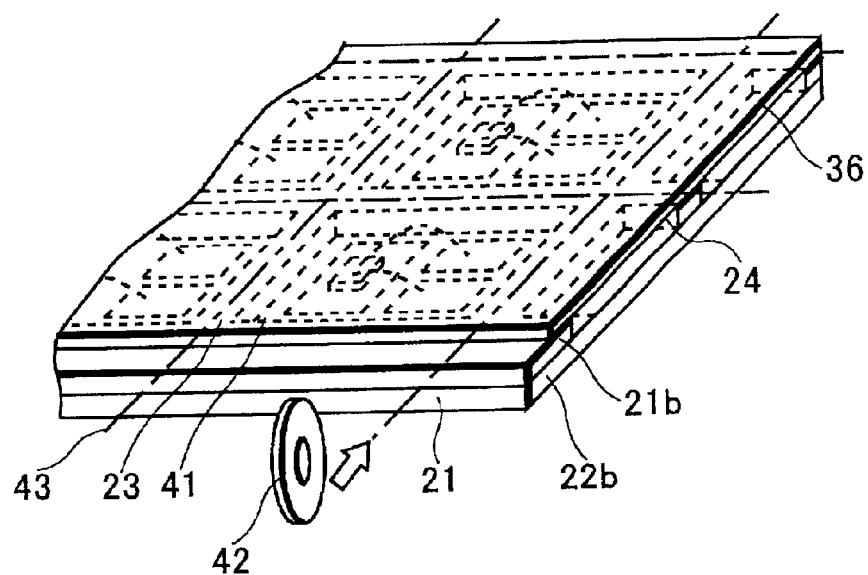
FIGS. 8A and 8B are perspective views showing the present invention.

Fifth Step: see FIG. 8A

Figure 8B:
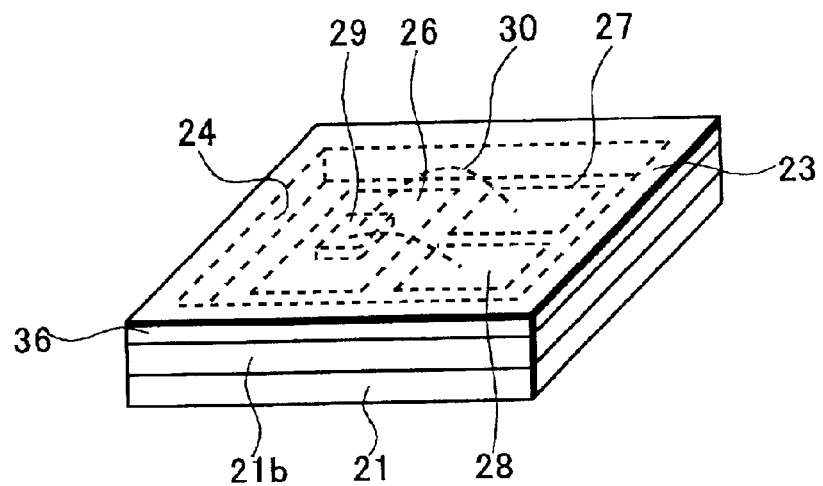
Figure 9A:
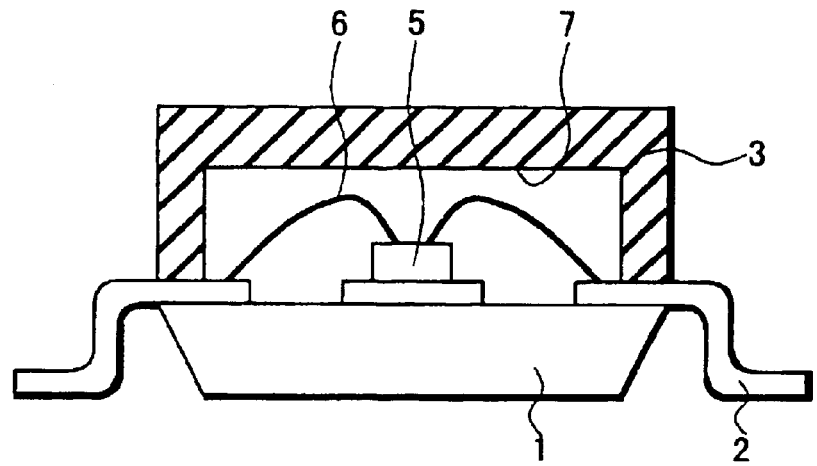
FIG. 9A is a sectional view of a conventional semiconductor device and FIG. 9B is a plan view thereof.
Figure 9B:
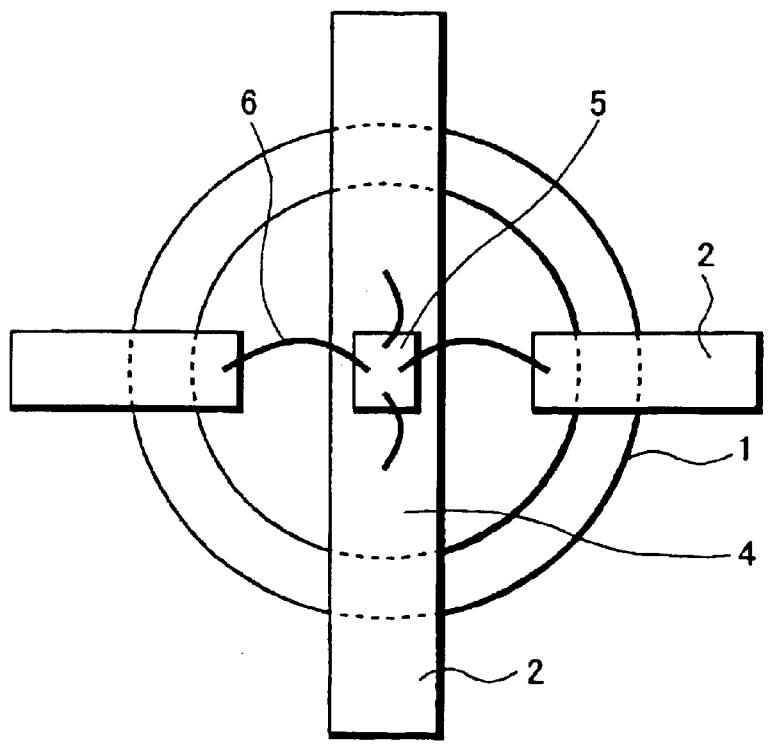

Then, individual devices shown in FIG. 8B can be obtained by dividing the substrate 21 into respective mounting portions 41 based on alignment marks formed on the surface of the substrate 21. The dicing blade 42 is used to divide, and the dicing sheet is pasted on the second main face 22b side of the substrate 21 and then the substrate 21, the second substrate 21b, and the glass plate 36 are collectively cut away along the dicing lines 43 vertically and laterally. In this case, the dicing line 43 is positioned in the center of the column portion 23. Also, the dicing may be applied from the second main face 22b side.

As described above, according to the semiconductor device of the present invention, since the transparent glass plate is employed to seal the semiconductor chip, the bonding wires, etc. airtightly in the hollow space, the state of the adhered portion between the glass plate and the column portion can be checked by the visual inspection. Also, since the light-shielding adhesive resin is applied to the entire surface of the adhered surface of the glass plate, there can be prevented such an event that the light that transmits through the glass plate, enters into the concave portion and directly enters into the semiconductor chip, etc. and thus the degradation of the characteristic of the semiconductor chip, etc. is caused.

In addition, according to the semiconductor device manufacturing method of the present invention, since the light-shielding adhesive resin is previously applied to the overall adhesive surface of the glass plate that forms the hollow airtight structure, the semiconductor element, etc. can be adhered at a time onto a number of concave portions that are constructed by the substrate and the column portions. Therefore, the fabrication cost can be reduced extremely and the mass production can be carried out.

What is claimed is:

1. A semiconductor device comprising:

a supporting substrate made of insulating material;

a conductive pattern provided on a surface of the supporting substrate;

an external connecting terminal provided on a back surface of the supporting substrate and electrically connected to the conductive pattern through the substrate;

a circuit element provided on the conductive pattern;

a glass plate that covers the circuit element and that forms a hollow airtight portion between the supporting substrate and the glass plate; and a light-shielding adhesive resin applied over an entire surface of the glass plate.

2. A semiconductor device according to claim 1, wherein the circuit element includes a semiconductor element or a fuse element.

3. A semiconductor device comprising:

a substrate, a circuit member provided on the substrate;

a terminal provided on a back of the substrate and electrically connected to the circuit member through the substrate;

a wall surrounding the circuit member; and a transparent plate with a light-shielding adhesive resin provided over the transparent plate's entire surface, said transparent plate adhered on the wall and over the circuit member to form an airtight cavity between the substrate and the transparent plate.

4. The semiconductor device according to claim 3 wherein the circuit member comprises:

a conductive pattern disposed over the substrate; and a semiconductor chip disposed over the conductive pattern.

5. The semiconductor device according to claim 3 wherein the substrate comprises insulating material.

6. The semiconductor device according to claim 3, wherein the circuit member includes a fuse element.

7. The semiconductor device according to claim 1, wherein said external connecting terminal is electrically connected to the conductive pattern through the substrate by a via hole.

8. The semiconductor device according to claim 3, wherein said terminal is electrically connected to the conductive pattern through the substrate by a via hole.

9. The semiconductor device according to claim 7, wherein said via hole extends substantially straight between an internal surface and an external surface of the substrate.

10. The semiconductor device according to claim 8, wherein said via hole extends substantially straight between an internal surface and an external surface of the substrate.

* * * * *